(12) United States Patent
Huang

(10) Patent No.: US 9,231,568 B2
(45) Date of Patent: Jan. 5, 2016

(54) CIRCUIT REDUCING PHASE NOISE OF OSCILLATOR

(71) Applicant: Shun-Fu Technology Corp., Taipei (TW)

(72) Inventor: Yung-Sheng Huang, Taipei (TW)

(73) Assignee: SHUN-FU TECHNOLOGY CORP., Taipei (TW)

( * ) Notice: Subject to any disclaimer, the term of this patent is extended or adjusted under 35 U.S.C. 154(b) by 51 days.

(21) Appl. No.: 13/922,127

(22) Filed: Jun. 19, 2013

(65) Prior Publication Data

US 2014/0002206 A1 Jan. 2, 2014

(30) Foreign Application Priority Data

Jun. 27, 2012 (TW) .............................. 101122952 A

(51) Int. Cl.
*H03B 5/12* (2006.01)
*H03K 3/03* (2006.01)
(52) U.S. Cl.
CPC ............ *H03K 3/0322* (2013.01); *H03B 5/1212* (2013.01); *H03B 5/1228* (2013.01); *H03B 2200/009* (2013.01); *H03B 2202/07* (2013.01); *H03B 2202/076* (2013.01)

(58) Field of Classification Search
CPC ...... H03B 1/04; H03B 5/1225; H03B 5/1212; H03B 5/1228; H03B 2202/07; H03B 2202/076; H03B 2202/073; H03B 2200/009; H03B 2202/08; H03K 3/0322; H03K 3/0315
USPC ............................. 331/117 R, 117 FE, 175, 57
See application file for complete search history.

(56) References Cited

U.S. PATENT DOCUMENTS

| 5,451,911 | A | * | 9/1995 | Colvin et al. | .................... 331/57 |
| 5,561,398 | A | * | 10/1996 | Rasmussen | ................. 331/36 C |
| 7,884,677 | B2 | * | 2/2011 | Sutardja | .................. 331/117 FE |
| 8,198,946 | B2 | * | 6/2012 | Satoh | ............... 331/74 |

* cited by examiner

*Primary Examiner* — Ryan Johnson
(74) *Attorney, Agent, or Firm* — Guice Patents PLLC

(57) ABSTRACT

A circuit reducing phase noise of an oscillator includes a transistor, an impedance element coupled to the transistor, an inverting circuit coupled to one end of the impedance element, and an add circuit coupled to the inverting circuit and the other end of the impedance element, wherein the signals from the two ends of the impedance element is superimposed and sent out to reduce phase noise of an oscillator.

8 Claims, 10 Drawing Sheets

CIRCUIT REDUCING PHASE NOISE OF OSCILLATOR

BACKGROUND OF THE INVENTION

1. Field of the Invention

The invention relates to a circuit reducing noise, and in particular to a circuit reducing phase noise of an oscillator.

2. Description of the Related Art

Voltage controlled oscillator is an oscillating circuit having oscillating frequency controlled by input voltage. The oscillating frequency is varied by direct current. The voltage controlled oscillator is interfered to generate phase noise. The main interference sources are a) inductance-capacitor circuit has too small quality factor in inductance; b) the active element MOS (bipolar) and current source generate flicker noise or thermal noise; c) in bias voltage VDD/VSS, noise is generated by other circuit.

Referring to FIG. 1, a conventional inductance-capacitor circuit including a first field effect transistor 70 and a second field effect transistor 71. The gate and drain of the first field effect transistor 70 are cross coupled to the drain and gate of the second field effect transistor 71 respectively to generate negative resistance and continuous oscillation. The oscillation frequency depends on the total inductance-capacitor of the spiral inductance 72, the varactor diode 73 and the parasitic elements of transistor. The signals output by the drain 14 of the first field effect transistor 70 and the second field effect transistor 71 has the same wave-form and amplitude but opposite phase.

Since the quality factor for a typical spiral inductance 72 is about 5 to 12 and generally the field effect transistor has much noise, the inductance-capacitor oscillating circuit generates much phase noise which must be reduced.

SUMMARY OF THE INVENTION

The object of the invention is to provide a circuit reducing phase noise of an oscillator.

The invention provides a circuit reducing phase noise of an oscillator including a transistor; an impedance element coupled to the transistor; a inverting circuit coupled to one end of the impedance element; and an add circuit coupled to the inverting circuit and the other end of the impedance element, wherein the signals from the two ends of the impedance element is superimposed and sent out to reduce phase noise of an oscillator.

In an embodiment of the invention, the transistor can be a field effect transistor or a bipolar junction transistor.

The invention also provides a circuit reducing phase noise of an oscillator including a first field effect transistor; a second field effect transistor cross coupled to the first field effect transistor by a gate and a drain; an impedance element coupled to the gate and the drain; a inverting circuit coupled to one end of the impedance element; and an add circuit coupled to the inverting circuit and the other end of the impedance element, wherein the signals from the two ends of the impedance element is superimposed and sent out to reduce phase noise of an oscillator.

BRIEF DESCRIPTION OF THE DRAWINGS

The invention can be fully understood by reading the subsequent detailed description and examples with references made to the accompanying drawings, wherein.

DETAILED DESCRIPTION OF THE INVENTION

Figure 1:
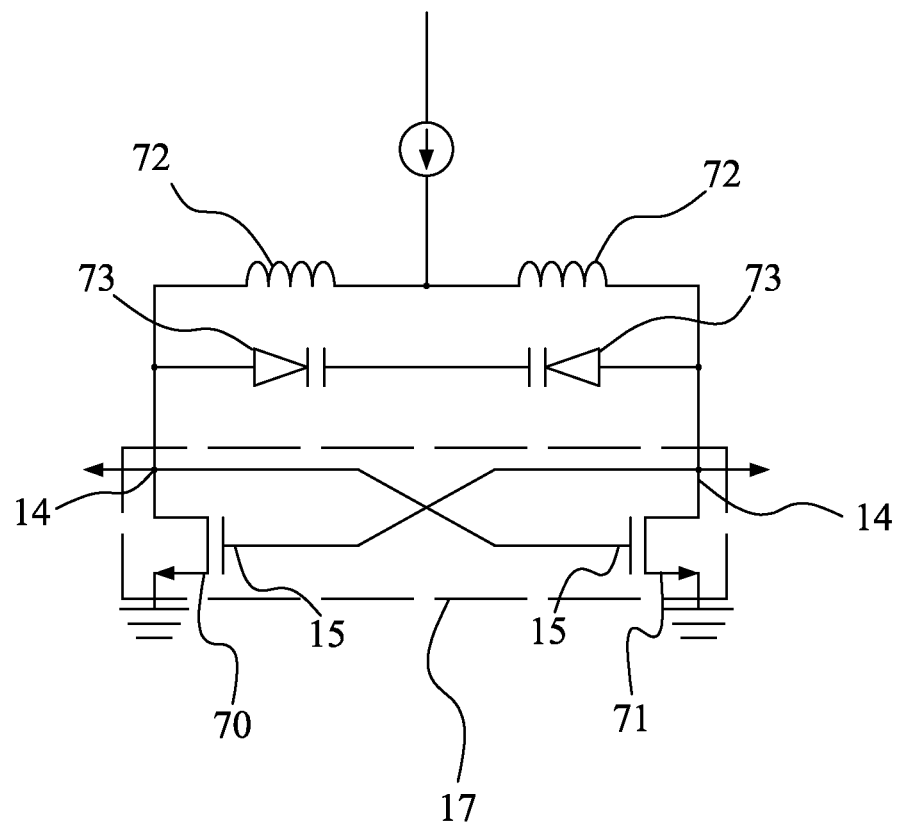
FIG. 1 is a circuit diagram of a conventional inductance-capacitor oscillating circuit.
Figure 2:
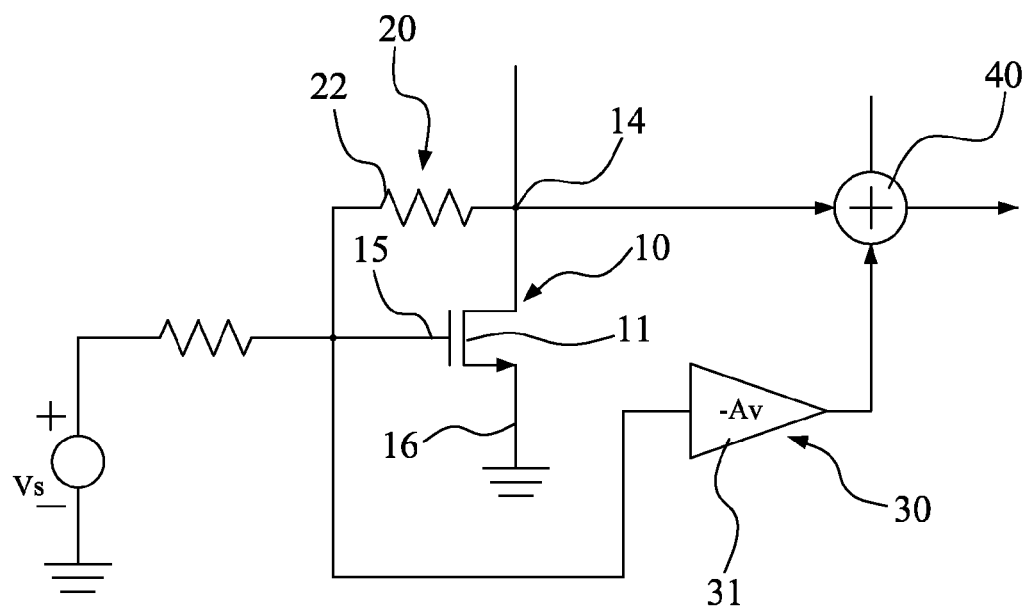
FIG. 2 is a circuit diagram of the invention.

Referring to FIG. 2, the circuit includes a field effect transistor 10. The invention is not limited thereto, the transistor can be a bipolar junction transistor. In this embodiment, the field effect transistor 10 is an N type field effect transistor 11 having a drain 14, a gate 15 and a source 16. An impedance element 20 is coupled to the drain 14 and the gate 15. In this embodiment, the impedance element 20 is a resistance 22. The gate 15 of the field effect transistor 11 is coupled to an oscillator, whereby the signal from the oscillator is sent to the circuit reducing noise of the invention. An inverting circuit 30 is coupled to the gate 15. The inverting circuit 30 of the embodiment is an inverting amplifier 31 in this embodiment. An add circuit 40 is coupled to the drain 14. Signals with noise from the gate 15 are invert amplified and sent to the add circuit 40 to be super imposed with the signals from the drain 14.

The signals from the drain 14 and the gate 15 are inverted by the impedance element 20 and the N type field effect transistor 11, and the noise is kept to be the same phase. The noise is eliminated by invert amplifying and superimposing the signals and noise of the drain 14 and the gate 15. The field effect transistor of the invention is not limited to the N type field effect transistor and the impedance element of the invention is not limited to the resistance. The transistor of the invention can be a P type field effect transistor or a bipolar junction transistor, and the impedance element can be an inductance, a capacitor, a resistance or combination of them.

The equation for reducing the noise is described as follows. The $g_{mi}$ represent the amplifier, the input impedance $$Zin = \frac{1}{g_{mi}},$$

and the voltage gain $$A_{VF} = \frac{V_Y}{V_X} = 1 - g_{mi} \cdot R.$$

The noise current of the field effect transistor 10 is $I_{ni}$, and noise current at the drain 14 is $\alpha \cdot I_{ni}$, where $0<\alpha<1$. The noise current flows from the drain 14 to the impedance element 20 and to the gate 15 and to Rs and to 0. The noise current therefore has the same phase at the drain 14 and the gate 15, but the signal voltage is inverted. The $A_{VF}$ is therefore a negative value and is able to eliminate noise and amplifies input signals.

The noise voltage in the gate 15 ($V_{X,n,i}$) and the drain 14 ($V_{Y,n,i}$) are $$V_{X,n,i} = \alpha(R_S, g_{mi}) \cdot I_{n,i} \cdot R_S$$

$$V_{Y,n,i} = \alpha(R_S, g_{mi}) \cdot I_{n,i} \cdot (R_S + R)$$

The noise output ($V_{OUT,n,i}$) is $$V_{OUT,n,i} = V_{Y,n,i} - V_{X,n,i} \cdot A_V = \alpha(R_S, g_{mi}) \cdot I_{ni}(R + R_S - A_V R_S)$$

When the noise output is 0, $$A_{V,C} = \frac{V_{Y,n,i}}{V_{X,n,i}} = 1 + \frac{R}{R_S}$$

To eliminate the output noise voltage, the voltage gain of the inverting amplifier 31 is $$A_{V,C} = 1 + \frac{R}{R_S},$$

and $$A_{V,C} = \frac{V_{OUT}}{V_X} = 1 - g_{mi} \cdot R - A_{V,C} = -g_{mi} \cdot R - \frac{R}{R_S} = -2\frac{R}{R_S},$$

therefore the total voltage gain is $$A_{VF,C} = -2\frac{R}{R_S}.$$

The noise factor is represented as follows.

$F = 1 + EF_{MD} + EF_R + EF_A$, where EF represent the excess noise factor, MD represent the matching device, R represents resistor and A represents amplifier.

$$\therefore EF_{MD} = NEF\frac{(R + R_S - A_V \cdot R_S)^2}{R_S \cdot A_{VF}^2};$$

$$EF_R = \frac{1}{A_V - 1} = \frac{-2}{A_{VF}};$$

$$EF_A = NEF\frac{8 - 6 \cdot A_{VF} + A_{VF}^2}{g_{m2} \cdot R_S \cdot A_{VF}^2};$$

$A_{V,C}$ is the noise reduce of $A_V$, then $$EF_{MD,C} = 0$$

$$EF_{R,C} = -\frac{2}{A_{VF,C}} = \frac{R_S}{R};$$

$$EF_{A,C} = \frac{NEF}{g_{m2}}\left(\frac{1}{R_S} + \frac{3}{R} + \frac{2R_S}{R^2}\right);$$

Figure 3:
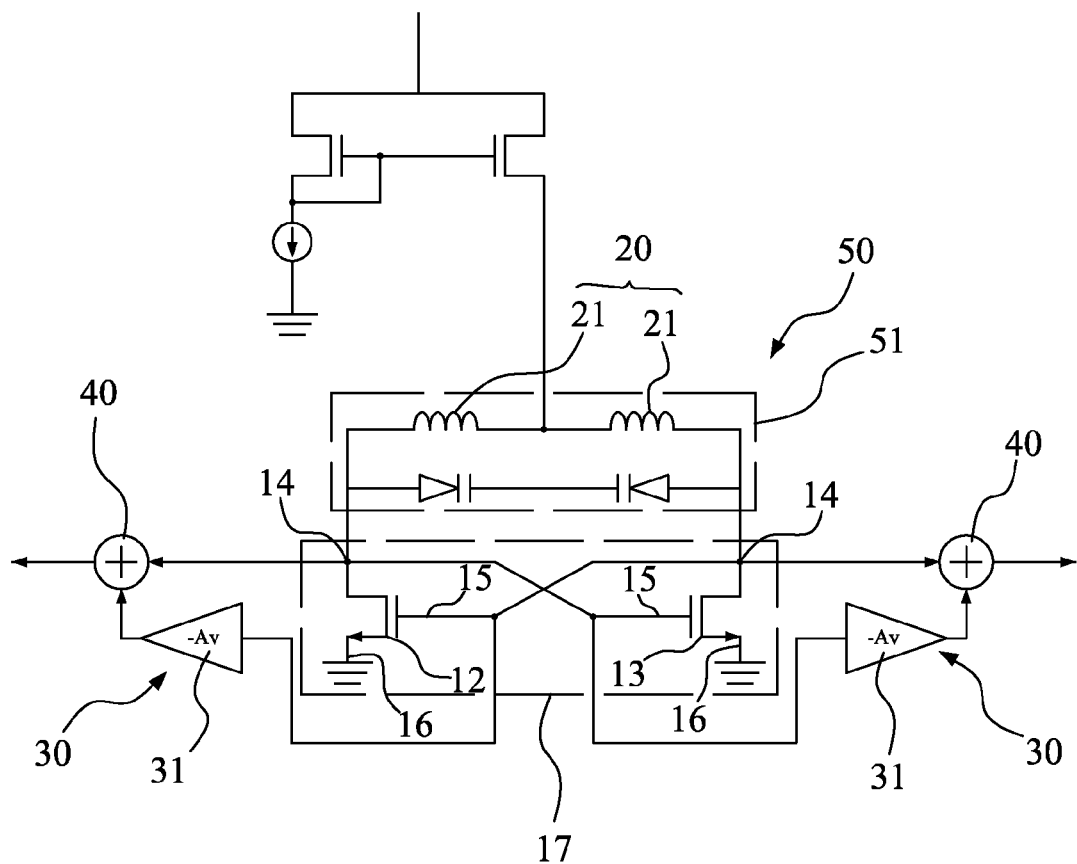
FIG. 3 is a circuit diagram of an embodiment of the circuit of the invention connected to an oscillator.
Figure 4:
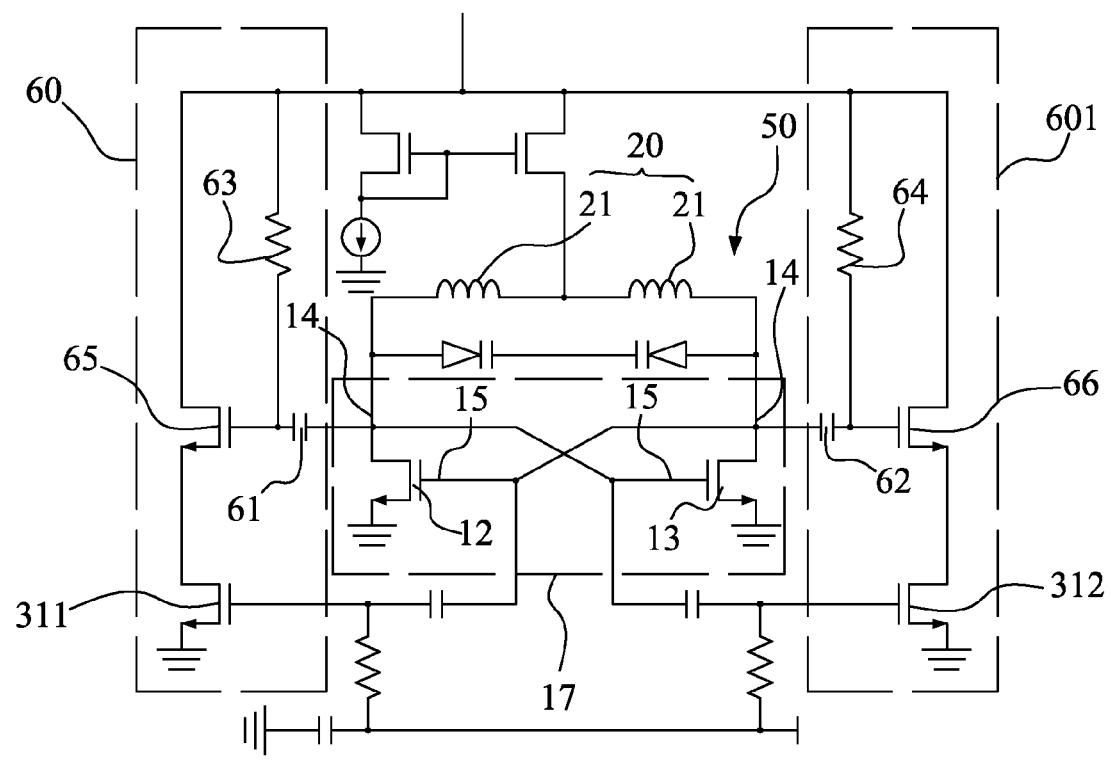
FIG. 4 is a circuit diagram of another embodiment of the circuit of the invention connected to an oscillator.

Referring to FIG. 3, the oscillator 50 is an inductance-capacitor resonance circuit 51. The inductance-capacitor resonance circuit 51 includes a cross coupled pair 17 including a first N type field effect transistor 12 and a second N type field effect transistor 13. Two serial connected inductances 21 is coupled to the drain 14 and the gate 15 of the cross coupled pair 17. The internal resistance of the inductance 21 provides impedance for the first N type field effect transistor 12 and the second N type field effect transistor 13, so that the inductance 21 acts as an impedance element 20 and allow cross coupled pair 17 amplify and invert the noise. An inverting circuit 30 is coupled to the gate 15 of the first N type field effect transistor 12 and the second N type field effect transistor 13. In this embodiment, the inverting circuit is an inverting amplifier 31 and inverts the signal from the gate 15. The drains 14 of the first N type field effect transistor 12 and the second N type field effect transistor 13 are coupled to a add circuit 40 which superimposes the signals from the drain 14 and the gate 15 to eliminate noise and amplify the oscillating signals.

referring to FIG. 4, in this embodiment, the circuit reducing noise includes an oscillator 50, a first N type field effect transistor 12 and a second N type field effect transistor 13. The drain 14 and the gate 15 of the first N type field effect transistor 12 are coupled to the gate 15 and the drain 14 of the second N type field effect transistor 13 to form a cross couple pair 17. A first high-pass filter 60 including a first resistance 63 and a first capacitor 61 and a second high-pass filter 601 including a second resistance 64 and a second capacitor 62 are coupled to the oscillator 50 and the drain 14 of the first N type field effect transistor 12 and the second N type field effect transistor 13 to eliminate the low frequency noise from the oscillator 50. Two serial connected inductances 21 is coupled to the drain 14 and the gate 15 of the cross coupled pair 17. The internal resistance of the inductance 21 provides impedance for the first N type field effect transistor 12 and the second N type field effect transistor 13, so that the inductance 21 acts as an impedance element 20 and allow cross coupled pair 17 amplify and invert the noise. A first inverting amplifier 311 and the second inverting amplifier 312 invert the oscillating signals which are inverted by the cross coupled pair 17 and the noise which is amplified by the cross coupled pair 17. A first drain follower 65 and a second drain follower 66 are coupled to the oscillator 50 to obtain the oscillating signals and noise which is not inverted and superimpose the signals to eliminate noise.

Figure 5:
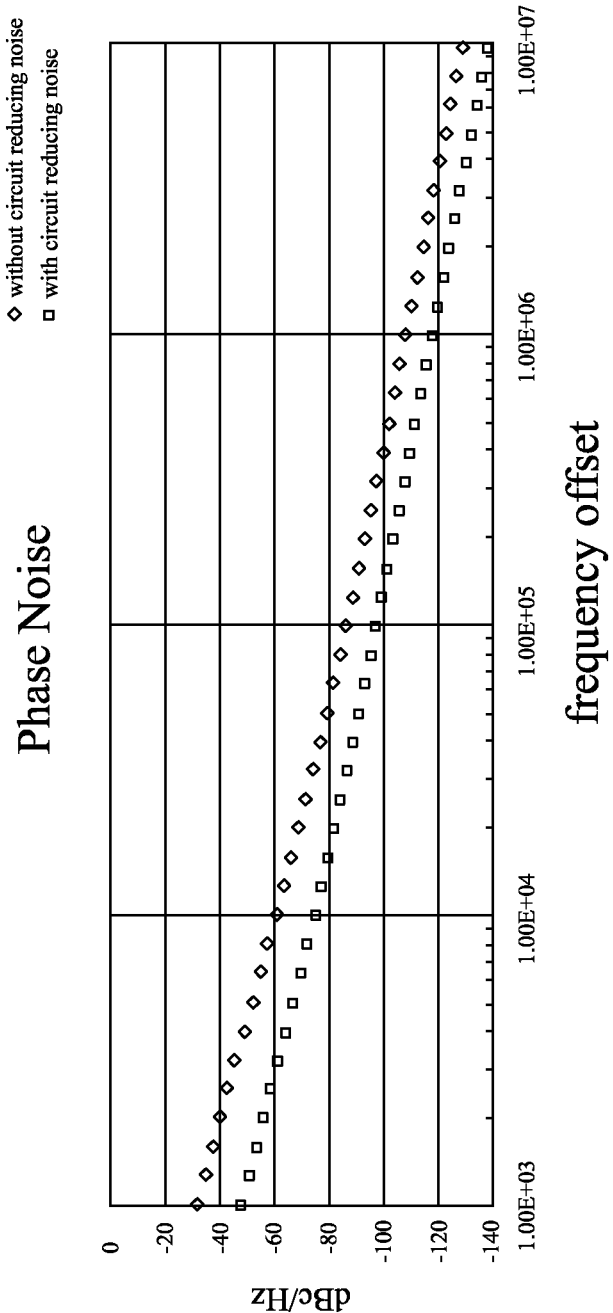
FIG. 5 is a data diagram of reduce of noise of the embodiment of FIG. 4.
Figure 6:
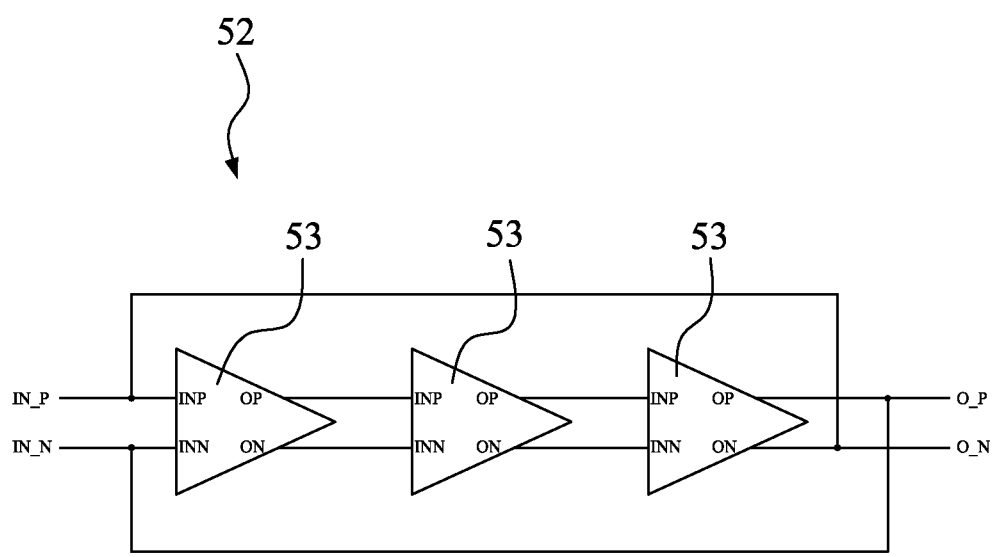
FIG. 6 depicts an looped oscillator of another embodiment of the circuit of the invention.

FIG. 5 depicts data of a simulation circuit using CMOS 0.18 μm RF/MM process model parameters. When frequency of the circuit is 2.4 GHz, the noise is about 85 dBc/Hz, where the circuit reducing noise of the invention is not installed and carrier frequency offset is 100 kHz. The noise can be reduced to be 96 dBc/Hz when the circuit reducing noise of the invention is installed.

Figure 7:
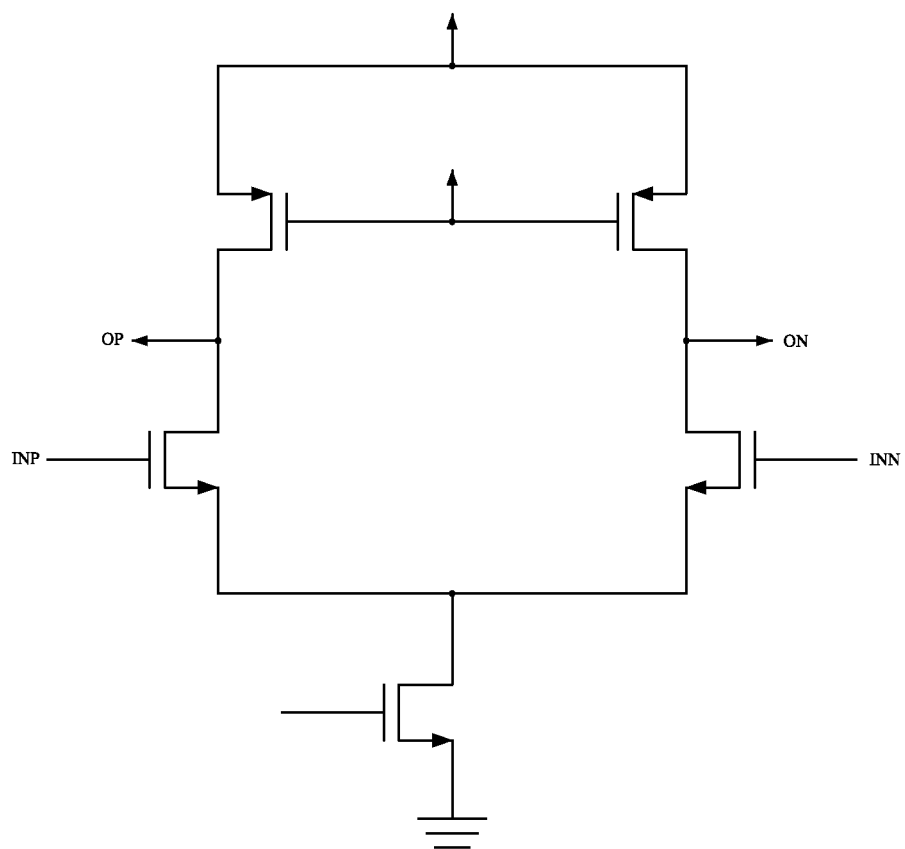
FIG. 7 depicts a delay cell of the embodiment of FIG. 6.
Figure 8:
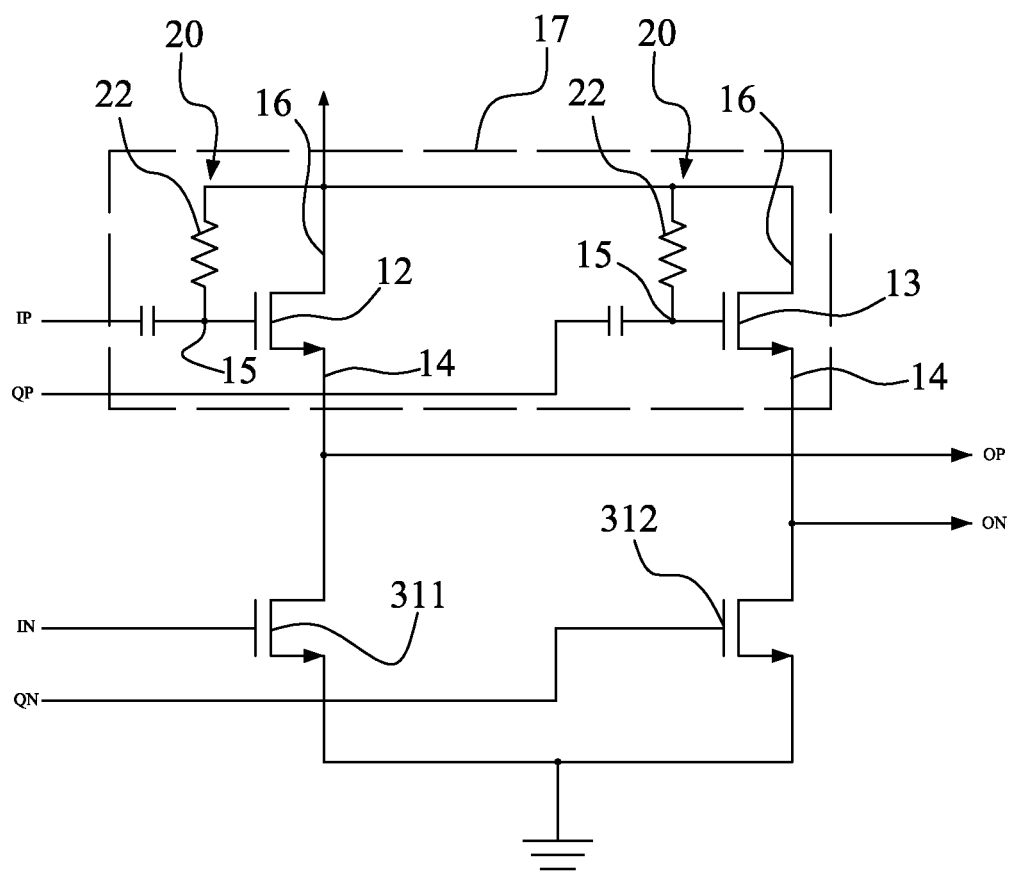
FIG. 8 depicts the connection of the delay cell and the circuit of the invention.
Figure 9:
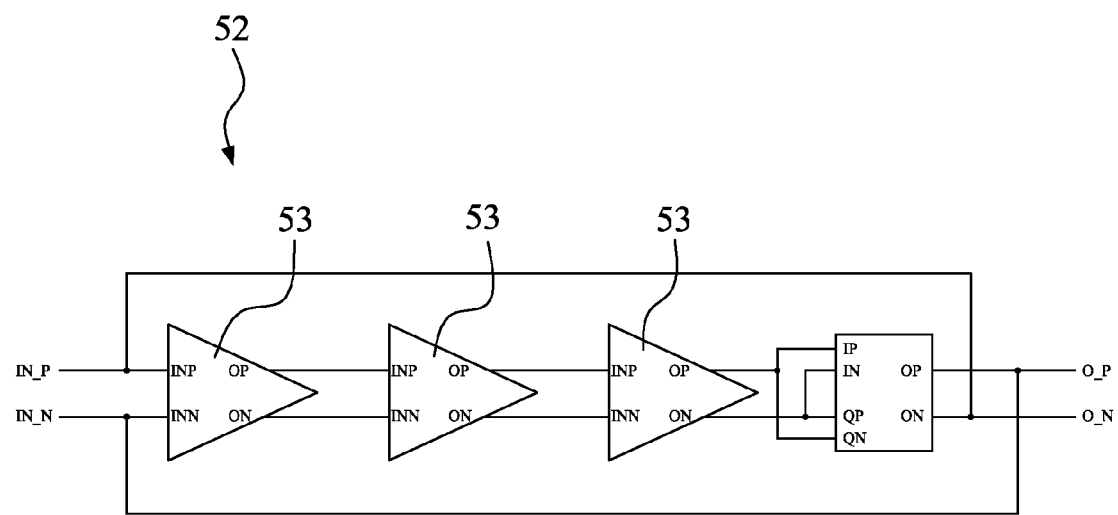
FIG. 9 depicts the connection of the looped oscillator and the circuit of the invention.

Referring to FIGS. 6 to 10, FIG. 6 depicts a looped oscillator 52 having a third degree delay cell 53. FIG. 7 depicts the circuit for each degree delay cell. Since the looped oscillator 52 and the third degree delay cell 53 are not the main feature of the invention, the description for the structure of the looped oscillator 52 and the third degree delay cell 53 is omitted. FIG. 8 is the circuit reducing noise of the invention. FIG. 9 depicts the looped oscillator 52 connected to the circuit reducing noise of the invention.

In this embodiment, the circuit reducing noise of the invention includes a cross coupled pair 17 including a first N type field effect transistor 12 and a second N type field effect transistor 13. The drain 14 and the gate 15 of the first N type field effect transistor 12 are coupled to the gate 15 and the drain 14 of the second N type field effect transistor 13 to form the cross couple pair 17. Resistances 22 which are coupled to the drain 14 and the gate 15 of the first N type field effect transistor 12 and the second N type field effect transistor 13 serves as an impedance element 20 to amplify noise and invert the oscillating signals. A first inverting amplifier 311 and a second inverting amplifier 312 are coupled to the gate 15 of the first N type field effect transistor 12 and the second N type field effect transistor 13 invert the oscillating signals which are inverted by the cross coupled pair 17 and the noise which is amplified by the cross coupled pair 17. Signals from the drain 14 of the first N type field effect transistor 12 and the second N type field effect transistor 13 are superimposed with the inverted signals from the first inverting amplifier 311 and the second inverting amplifier 312 to eliminate noise.

Figure 10:
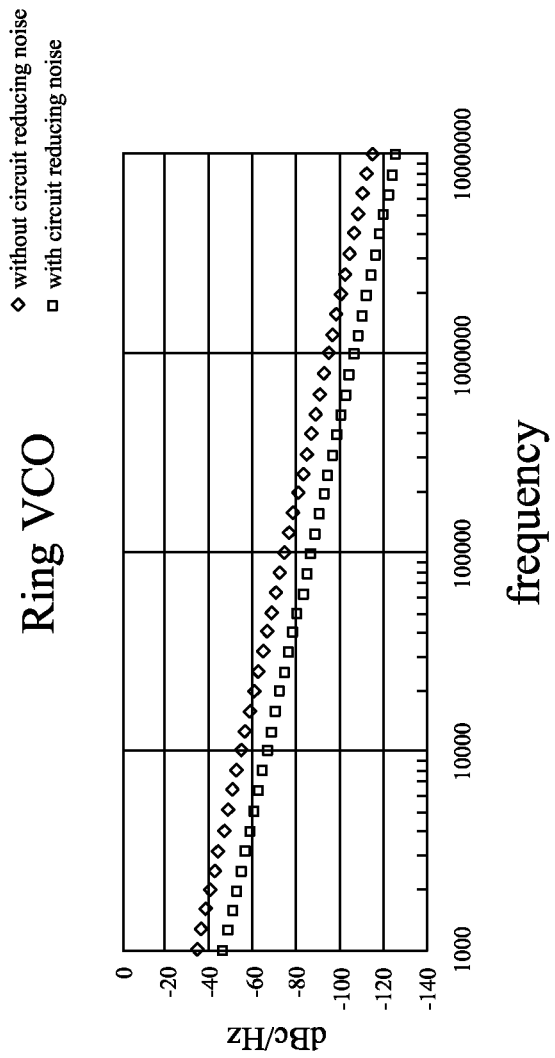
FIG. 10 is a data diagram of noise reduce of the embodiment of FIG. 6.

FIG. 10 shows result of the noise reduce. The phase noise is about −79.8 dBc/Hz @ 100 kHz when the circuit reducing noise is not installed. The phase noise is about −86.76 dBc/Hz @ 100 kHz when the circuit reducing noise is installed.

In the invention, the field effect transistor and the impedance element coupled to the field effect transistor invert the oscillating signals without influencing noise. The inverting circuit and the add circuit superimpose the original oscillating signal and the inverted oscillating signal to eliminate the noise.

While the invention has been described by way of example and in terms of preferred embodiments, it is to be understood that the invention is not limited thereto. To the contrary, it is intended to cover various modification and similar arrangement (as would be apparent to those skilled in the art). Therefore, the scope of the appended claims should be accorded the broadest interpretation so as to encompass all such modification and similar arrangements.

What the invention claimed is:

1. A circuit for reducing phase noise of an oscillator, comprising:
   a transistor;
   an impedance element coupled to the transistor;
   an inverting circuit coupled to one end of the impedance element; and
   an add circuit coupled to the inverting circuit and the other end of the impedance element, wherein the signals from the two ends of the impedance element are superimposed and output to reduce the phase noise of the oscillator;
   wherein the impedance element and the inverting circuit are electrically connected to the gate of the transistor, and the impedance element and the add circuit are electrically connected to the drain of the transistor;
   wherein the transistor is a field effect transistor, and the impedance element is coupled to a drain and a gate of the field effect transistor, signals from the drain and the gate are inverted by the impedance element and the field effect transistor, the phase noise is kept in a same phase, and the phase noise is reduced by invert amplifying and superimposing the signals and the phase noise of the drain and the gate.

2. The circuit as claimed in claim 1, wherein the field effect transistor is an N type field effect transistor.

3. The circuit as claimed in claim 1, wherein the field effect transistor is a P type field effect transistor.

4. The circuit as claimed in claim 1, wherein the impedance element is a resistance.

5. A circuit for reducing phase noise of an oscillator, comprising:
   a first field effect transistor;
   a second field effect transistor cross coupled with the first field effect transistor;
   an impedance element coupled between a drain of the first field effect transistor and a drain of the second field effect transistor;
   an inverting circuit coupled to one end of the impedance element; and
   an add circuit coupled to the inverting circuit and the other end of the impedance element, wherein the signals from the two ends of the impedance element are superimposed and output to reduce the phase noise of the oscillator;
   wherein the inverting circuit is electrically connected to a gate of the first field effect transistor and a gate of the second field effect transistor, and the impedance element and the add circuit are electrically connected to the drain of the first filed field effect transistor and the drain of the second field effect transistor;
   wherein the inverting circuit is electrically connected to a gate of the first field effect transistor and a gate of the second field effect transistor, and the impedance element and the add circuit are electrically connected to the drain of the first filed field effect transistor and the drain of the second field effect transistor, wherein the inverting circuit inverting the signal from the gate of the first field effect transistor and the gate of the second field effect transistor, and the add circuit superimposing the signals from the drain of the first field effect transistor and the drain of the second field effect transistor and the gate of the first field effect transistor and the gate of the second field effect transistor reducing the phase noise and amplifying the oscillating signals.

6. The circuit as claimed in claim 5, wherein the first field effect transistor and the second field effect transistor are N type field effect transistors.

7. The circuit as claimed in claim 5, wherein the first field effect transistor and the second field effect transistor are P type field effect transistors.

8. The circuit as claimed in claim 5, wherein the impedance element is a resistance.

* * * * *